(12) United States Patent
Naruse et al.

(10) Patent No.: US 8,121,445 B2
(45) Date of Patent: Feb. 21, 2012

(54) OPTICAL DEVICE

(75) Inventors: Terukazu Naruse, Kanagawa (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 96 days.

(21) Appl. No.: 12/457,359

(22) Filed: Jun. 9, 2009

(65) Prior Publication Data

US 2010/0021107 A1    Jan. 28, 2010

(30) Foreign Application Priority Data

Jul. 24, 2008    (JP) .................................. 2008-190603

(51) Int. Cl.
G02B 6/00    (2006.01)
(52) U.S. Cl. ................ 385/14; 385/49; 385/88; 385/92; 385/93; 385/94; 385/89
(58) Field of Classification Search .................... 385/14, 385/92, 129, 130, 131
See application file for complete search history.

(56) References Cited

U.S. PATENT DOCUMENTS

| 7,187,828 B2 * | 3/2007 | Ohtsu et al. ..................... 385/52 |
| 2006/0140546 A1 * | 6/2006 | Nakata et al. ................... 385/88 |
| 2007/0080458 A1 * | 4/2007 | Ogawa et al. ................. 257/750 |

FOREIGN PATENT DOCUMENTS

| JP | 08-078657 A | 3/1996 |
| JP | 09-148746 | 6/1997 |
| JP | 11-242505 | 9/1999 |
| JP | 2002-359426 A | 12/2002 |
| JP | 2003-195123 | 7/2003 |
| JP | 2004-235418 A | 8/2004 |
| JP | 2006-189483 A | 7/2006 |

OTHER PUBLICATIONS

Japanese Office Action issued Apr. 13, 2010 for corresponding Japanese Application No. 2008-190603.
Japanese Office Action issued Mar. 29, 2011 for corresponding Japanese Application No. 2008-190603.

* cited by examiner

*Primary Examiner* — Charlie Peng
*Assistant Examiner* — Mary El Shammaa
(74) *Attorney, Agent, or Firm* — Rader, Fishman & Grauer PLLC

(57) ABSTRACT

An optical device includes: a multilayer structure substrate on which plural insulating layers are stacked and a wiring pattern is formed between layers; a recessed part for exposing the wiring pattern between the layers by cutting off a part of the multilayer structure substrate; an optical element mounted within the recessed part in electric conduction to the wiring pattern exposed by the recessed part; and an optical waveguide member forming an optical path for the optical element and guiding light along a surface of the multilayer structure substrate.

28 Claims, 6 Drawing Sheets

FIG. 6
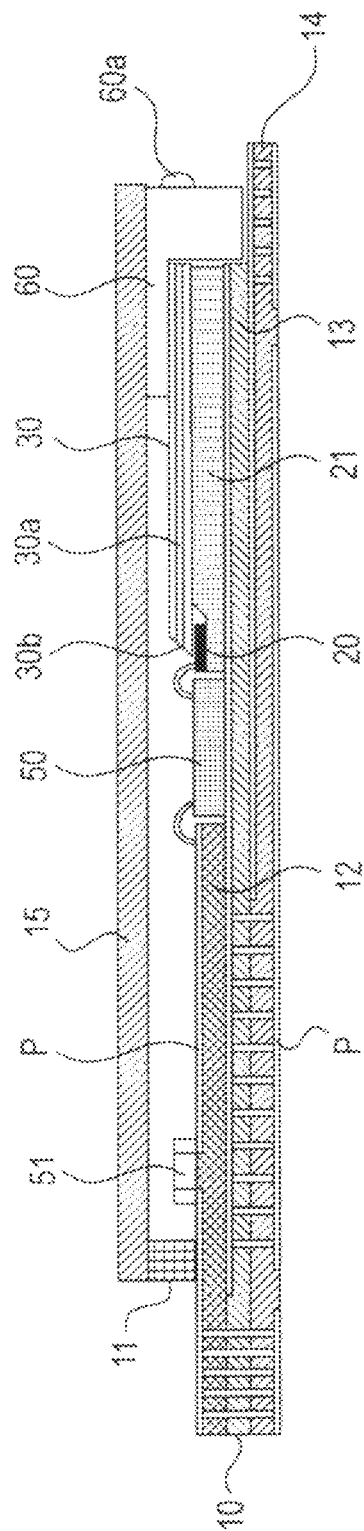
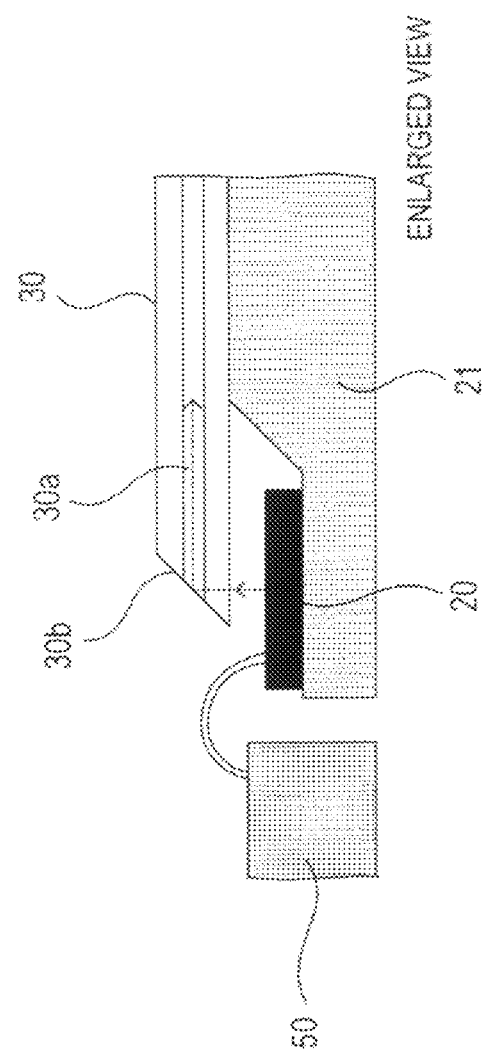
ENLARGED VIEW

OPTICAL DEVICE

BACKGROUND OF THE INVENTION

1. Field of the Invention

The present invention relates to an optical device that mounts electric components and optical components using a multilayer structure substrate on which a wiring pattern is formed between layers.

2. Background Art

In the past, for example, as shown in JP-A-10-242505, an optical transmission device has a mainstream structure in which wiring boards and optical components are mounted and sealed on a package that has been separately prepared. Further, in the case of using a surface emitting or receiving element, for example, as shown in JP-A-2003-195123, a structure in which an optical path conversion component that may require advanced positioning may be cited.

SUMMARY OF THE INVENTION

However, in the structure of JP-A-10-242505, its configuration is difficult for increase in the number of components and decrease in size, because it is necessary to separately fabricate the package, and the mounting process on the package is necessary. Further, in the structure of JP-A-2003-195123, it is necessary to mount some optical path conversion component that may require advanced positioning, and it is difficult to provide another function than optical conversion to the component.

It is desirable to provide an optical device that can be made highly functional, small, and thin in spite of a simple structure using a multilayer structure substrate provided with a packaging function on which a wiring pattern is formed between layers.

According to an embodiment of the present invention, there is provided an optical device including: a multilayer structure substrate on which plural insulating layers are stacked and a wiring pattern is formed between layers; a recessed part for exposing the wiring pattern between the layers by cutting off a part of the multilayer structure substrate; an optical element mounted within the recessed part in electric conduction to the wiring pattern exposed by the recessed part; and an optical waveguide member forming an optical path for the optical element and guiding light along a surface of the multilayer structure substrate.

In the embodiment of the invention, the recessed part is formed by cutting off a part of the multilayer structure substrate, the wiring pattern between layers is exposed, and the optical element is mounted within the recessed part, and thereby, the multilayer structure substrate as a wiring substrate also serves as a package of electronic components and optical components.

Specifically, an electronic component including a circuit for driving the optical element is mounted within the recessed part and electrically conducted to the wiring pattern exposed by the recessed part. Further, the optical path for the optical element is formed by the optical waveguide member, light is guided along the surface of the multilayer structure substrate, and thereby, transmission of outputting light to the outside and inputting light from the outside is performed.

As the optical element, there is not only an optical element directly connected to the wiring pattern within the recessed part but also one mounted via a support substrate. Further, the optical element may be of so-called surface emitting type for outputting light from the surface opposed to the mount surface or one having plural light emission points.

Further, to the optical waveguide member, an optical fiber that transmits light between the outside and itself may be connected or a lens member that diffuses or focuses light between the outside and itself may be connected. Further, a groove may be formed in a part of the optical waveguide in the optical waveguide member, and an optical fiber may be connected to the groove. Furthermore, a bevel worked surface is provided on an end of the optical waveguide member and an optical path direction between the optical element and the member is converted by the bevel worked surface.

According to the embodiment of the invention, since the multilayer structure substrate on which the wiring pattern is formed between layers also serves as a package, the optical device can be made highly functional, small, and thin in spite of a simple structure.

BRIEF DESCRIPTION OF THE DRAWINGS

FIG. 6 is a sectional view of the optical device according to the third embodiment.

DESCRIPTION OF THE PREFERRED EMBODIMENTS

Hereinafter, embodiments of the invention will be explained with reference to the drawings. In the embodiments, the case using a light emitting element as an optical element is taken as an example, however, the embodiments may also be applied to the case of using a light receiving element and the case of using both a light emitting element and a light receiving element.

First Embodiment

Figure 1:
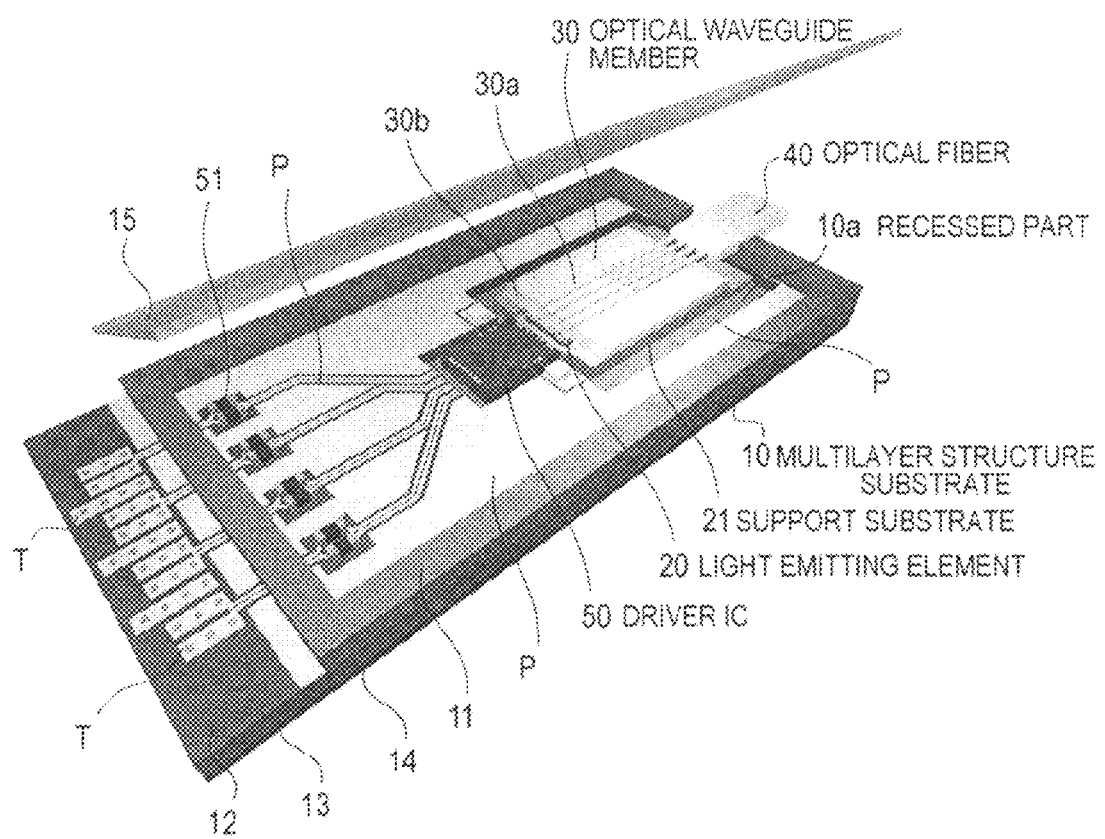
FIG. 1 is a perspective view of an optical device according to a first embodiment.
Figure 2:
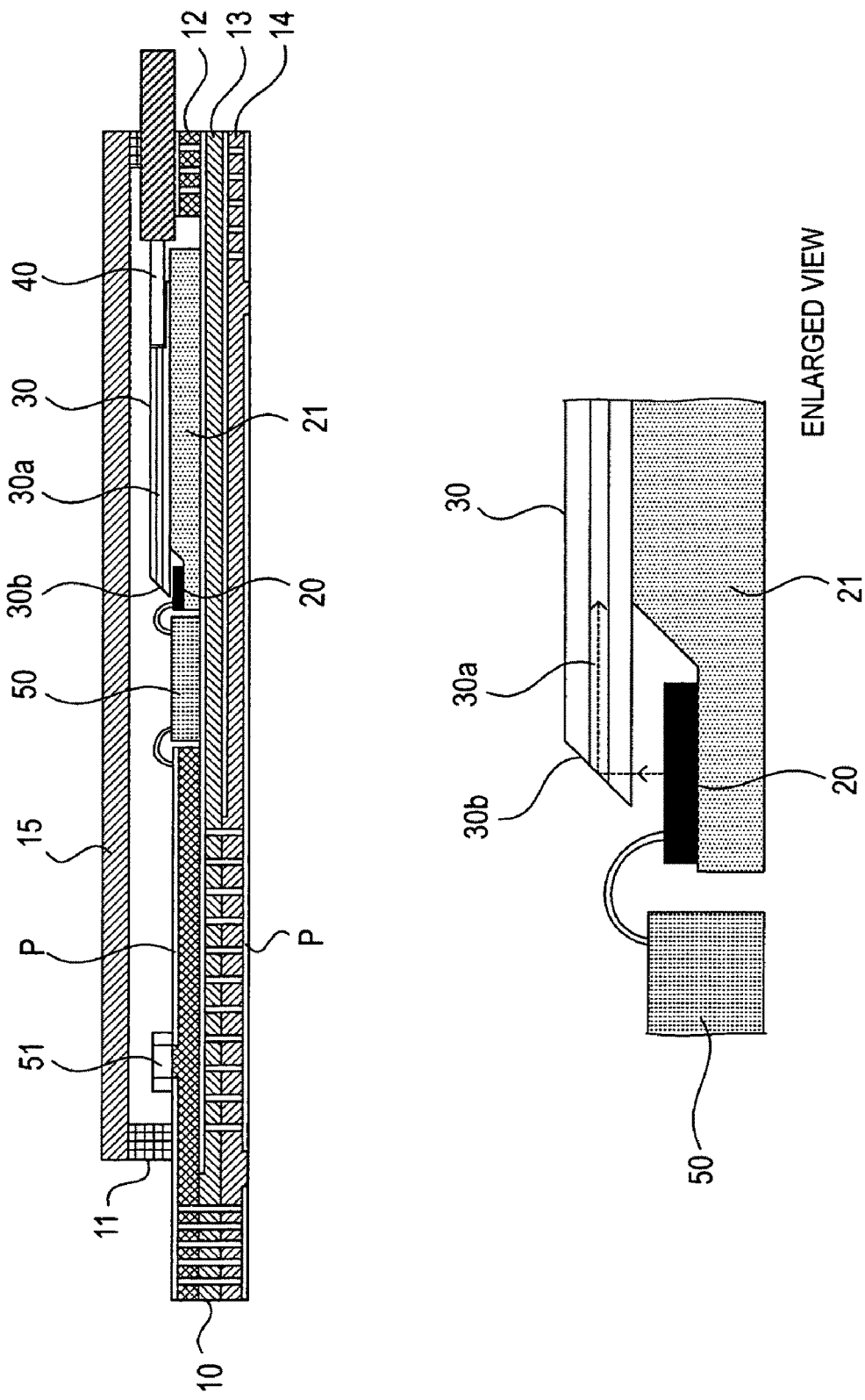
FIG. 2 is a sectional view of the optical device according to the first embodiment.

FIG. 1 is a perspective view of an optical device according to a first embodiment, FIG. 2 is a sectional view of the optical device according to the first embodiment. That is, the optical device according to the first embodiment includes a multilayer structure substrate 10, an optical element 20 mounted via a support substrate 21, and an optical waveguide member 30.

The multilayer structure substrate 10 includes at least two stacked layers (insulating layers) and a wiring pattern P formed between the layers. On the multilayer structure substrate 10, a recessed part 10a is formed by cutting off a part of the at least one layer including the uppermost layer, and a step structure is formed by the part with the recessed part 10a and the part without it.

The support substrate 21 is mounted in electric conduction to the wiring pattern P exposed by the recessed part 10a within the recessed part 10a of the multilayer structure substrate 10, and the light emitting element 20 is mounted on the support substrate 21. As the light emitting element 20, a surface emitting element that outputs light from a surface opposed to the mount surface is used, for example.

A first optical transmission path that can convert the optical path of the output light and transmit the light in a direction along the surface of the multilayer structure substrate 10 above the light emitting element 20. As the first optical transmission path, the optical waveguide member 30 including an optical waveguide for transmission of light is used.

A worked surface 30*b* worked with a bevel at 45 degrees, for example, is formed on one end of the optical waveguide member 30, and the light output from the underneath light emitting element 20 is reflected in a horizontal direction (in the direction of the surface of the multilayer structure substrate 10) for optical path conversion. Here, the bevel worked surface 30*b* on the end of the optical waveguide member 30 can be easily fabricated by dicing or the like. Further, an optical waveguide 30*a* provided on the optical waveguide member 30 can be easily and highly functionalized by providing a function of pitch conversion, branching, or the like to it.

A second optical transmission path is connected to the first optical transmission path. As the second optical transmission path, an optical fiber 40 is used. Using the optical fiber 40 for the second optical transmission path enables transmission of an optical signal output from the light emitting element 20 to the other devices with less loss even at a longer distance.

Here, to connect the second optical transmission path including the optical fiber 40 to the first optical transmission path as the optical waveguide member 30, a groove is formed on one end as an extension of the optical waveguide 30*a* in the optical waveguide member 30 and the optical fiber 40 is inserted into the groove. The size, position of the groove are adjusted so that the optical fiber 40 inserted into the groove may be optically coupled to the core of the optical waveguide 30*a*. Using such a structure, optical coupling between the core of the optical fiber 40 and the core of the optical waveguide 30*a* can be automatically made without the need of high-precision positioning. Thereby, the production cost can be reduced.

Further, when the light emitting element 20 outputs plural beams, of so-called multipoint emission type, plural optical waveguides 30*a* are provided on the optical waveguide member 30 as the first optical transmission path corresponding to the beams to be output from the light emission points. Furthermore, plural optical fibers 40 as the second optical transmission paths are connected correspondingly to the plural optical waveguides 30*a*.

Moreover, a thin film substrate 15 is fixed to cover the uppermost layer on the multilayer structure substrate 10 having the step structure. Thereby, the support substrate 21 mounted on the multilayer structure substrate 10, the light emitting element 20, the optical waveguide member 30 as the first optical transmission path are sealed within the multilayer structure substrate 10.

According to the structure, the multilayer structure substrate 10 having the step structure serves as a substrate for mounting the member and also serves as a package for sealing the member. Thus, it is not necessary to separately prepare a package as in the past. Therefore, the substrate itself becomes a package and the cost and size can be reduced.

Specific Example of First Embodiment

In the embodiment, a four-layer substrate using ceramics is used as the multilayer structure substrate 10, and the uppermost layer (a first layer 11) is formed in a frame shape by hollowing it with the periphery of about 1 mm left. The wiring pattern P including signal wires and power supply wires is fabricated on a second layer 12, and a part of the layer is partially hollowed to form the recessed part 10*a*. Further, electronic components such as a capacitor 51 are mounted on the second layer 12.

On the part of a third layer 13 in which the wiring pattern P is exposed within the recessed part 10*a* formed on the second layer 12, a driver IC 50 and an Si (silicon) platform as the support substrate 21 are mounted. A step is worked on the Si platform, and the light emitting element 20 as a surface emitting element is mounted on the lower part. The Si platform sets the height position of the light emitting element 20, and also serves to cool and electrically ground the light emitting element 20.

Further, the first optical transmission path (optical waveguide member 30) including a polymer thin film optical waveguide is mounted on the Si platform. One end of the polymer thin film optical waveguide is worked with a bevel at 45 degrees and its position is adjusted so that the optical path of the light radiated from the surface emitting array element (light emitting element 20) may be converted in total reflection by the worked surface 30*b* worked with the bevel at 45 degrees and optically coupled to the core of the optical waveguide 30*a*.

Furthermore, a groove is worked on the other end of the polymer thin film optical waveguide. The optical fiber 40 is mounted in the groove, and the width and depth of the groove are adjusted so that the light passing through the core of the optical waveguide 30*a* may be optically coupled to the core of the optical fiber 40.

The thin film substrate 15 of a resin substrate having a thickness of about 1 mm is bonded and fixed onto the substrate of the first layer 11 of the multilayer structure substrate 10, and the multilayer structure substrate 10 including ceramics four layers and the resin substrate 15 simply seal the electronic components and optical components mounted on the multilayer structure substrate 10 except the optical fiber 40.

As shown in FIG. 2, the wiring patterns P are formed between layers, on layer front surfaces and layer rear surfaces of the multilayer structure substrate 10, and electric conduction is provided by the wiring patterns P between other layers, on other layer front faces and layer rear faces and via holes according to need.

The multilayer structure substrate 10 has the electronic components such as the capacitor 51 mounted thereon and includes wiring patterns P for forming a circuit, and serves as a package of the electronic components and optical components. Accordingly, the first layer 11 as the uppermost layer is formed in the frame shape, and provided with the end of the next upper layer (second layer 12) exposed. Terminals T are formed on the exposed part on the end of the second layer 12 in conduction to the wiring patterns P, and electric signals are input and output in connection to an external interface.

In view of use of the multilayer structure substrate 10 as a package in a thinner thickness, the recessed part 10*a* for exposing the wiring pattern P of the third layer 13 is provided in a part of the second layer 12. By mounting the driver IC 50 and the light emitting element 20 via the support substrate 21 within the recessed part 10*a*, electric conduction can be obtained to the wiring pattern P of the third layer 13 on the driver IC 50 and the mount surface of the support substrate 21 according to need, and these members can be packaged on the lower position than the first layer 11 as the frame.

Here, the driver IC 50 is in conduction to the wiring pattern P of the third layer 13 (e.g., ground) on the mount surface (rear surface), and electrically connected to the wiring pattern P of the second layer 12 and the light emitting element 20 with bonding wires. Thereby, the driver IC 50 is driven by the signals (including the power supply) input from the terminals T formed on the end of the second layer 12, and light emission of the light emitting element 20 is controlled by the output of the driver IC 50.

The light emitting element 20 outputs light upward from the surface opposed to the mount surface. The output light is transmitted through a cladding part of the optical waveguide member 30 as the first optical transmission path and totally reflected on the worked surface 30b with the bevel at 45 degrees as the end of the core of the optical waveguide 30a. The totally reflected light propagates the core of the optical waveguide 30a and travels along the surface direction of the multilayer structure substrate 10. Further, the light enters the optical fiber 40 connected to the end of the optical waveguide 30a and sent to the outside via the optical fiber 40.

In the embodiment, the electronic components are mounted, the electronic components and the optical components are incorporated into the multilayer structure substrate 10 forming the electric circuit, sealed by the thin film substrate 15 for packaging, and thereby, it is not necessary to prepare a separate package. In addition, a very thin optical device having only a thickness of the multilayer structure substrate 10 and a thickness of the thin film substrate 15 (several millimeters in thickness) can be provided.

Second Embodiment

Figure 3:
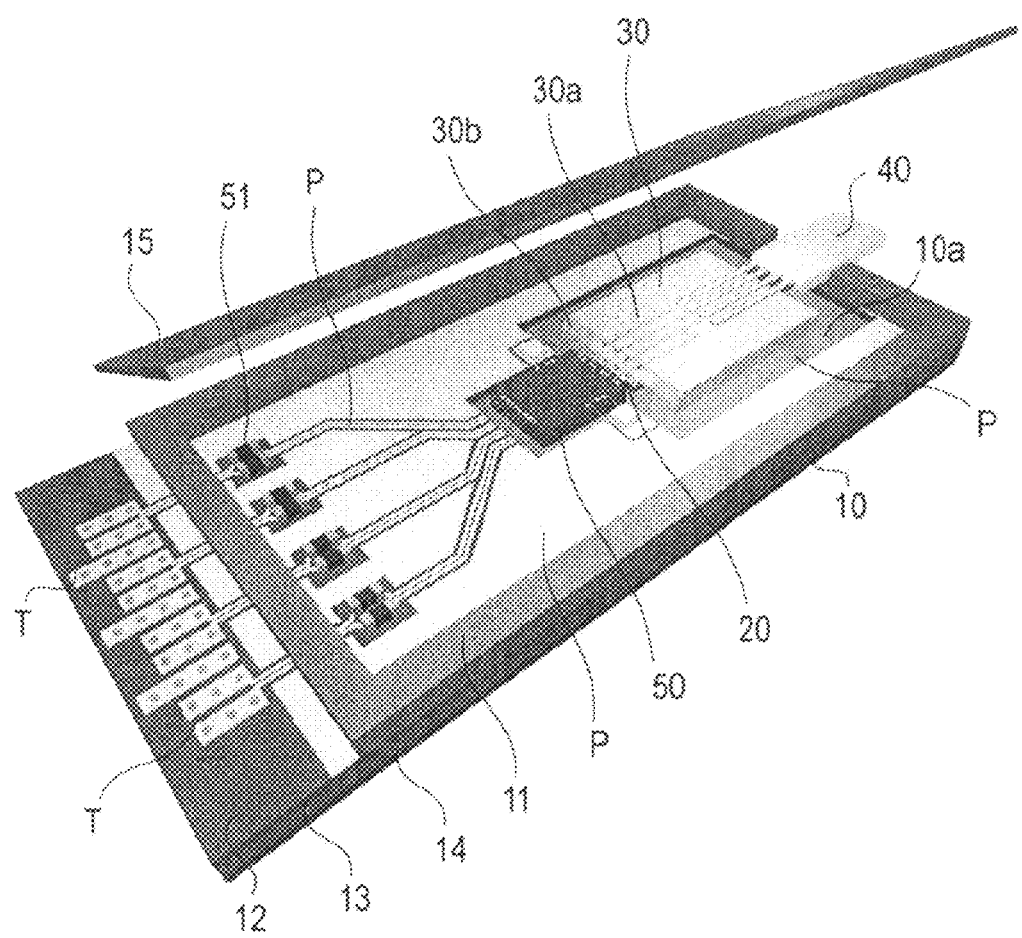
FIG. 3 is a perspective view of an optical device according to a second embodiment.
Figure 4:
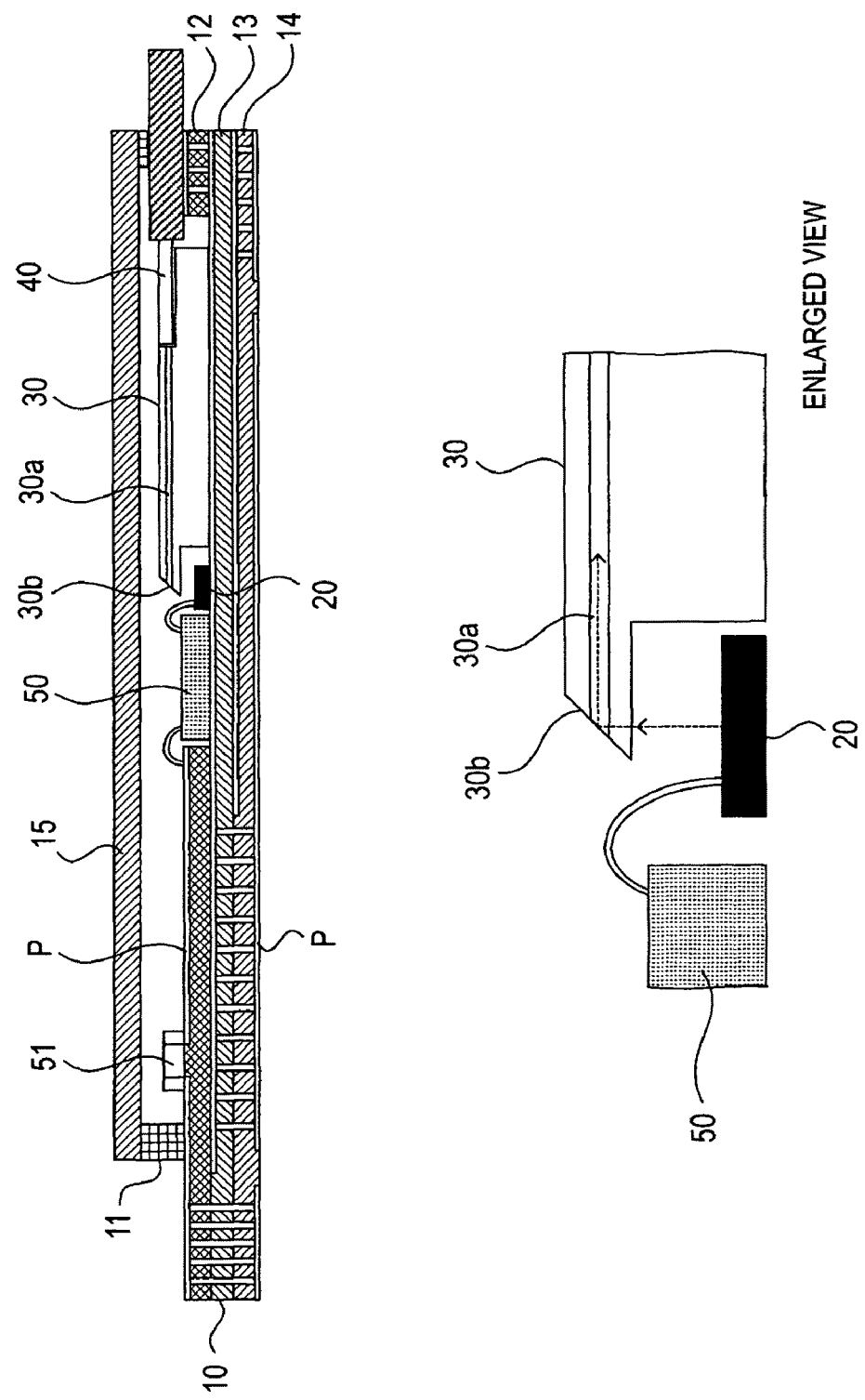
FIG. 4 is a sectional view of the optical device according to the second embodiment.

FIG. 3 is a perspective view of an optical device according to a second embodiment, FIG. 4 is a sectional view of the optical device according to the second embodiment. That is, the optical device according to the second embodiment includes a multilayer structure substrate 10, an optical element 20, and an optical waveguide member 30.

The multilayer structure substrate 10 includes at least two stacked layers (insulating layers) and a wiring pattern P formed between the layers. On the multilayer structure substrate 10, a recessed part 10a is formed by cutting off a part of the at least one layer including the uppermost layer, and a step structure is formed by the part with the recessed part 10a and the part without it.

The light emitting element 20 is mounted in electric conduction to the wiring pattern P exposed by the recessed part 10a within the recessed part 10a of the multilayer structure substrate 10. As the light emitting element 20, a surface emitting element that outputs light from a surface opposed to the mount surface is used, for example.

A first optical transmission path that can convert the optical path of the output light and transmit the light in a direction along the surface of the multilayer structure substrate 10 above the light emitting element 20. As the first optical transmission path, the optical waveguide member 30 including an optical waveguide for transmission of light is used.

A worked surface 30b worked with a bevel at 45 degrees, for example, is formed on one end of the optical waveguide member 30, and the light output from the underneath light emitting element 20 is reflected in a horizontal direction (in the direction of the surface of the multilayer structure substrate 10) for optical path conversion. Here, the bevel worked surface 30b on the end of the optical waveguide member 30 can be easily fabricated by dicing or the like. Further, an optical waveguide 30a provided on the optical waveguide member 30 can be easily and highly functionalized by providing a function of pitch conversion, branching, or the like to it.

A second optical transmission path is connected to the first optical transmission path. As the second optical transmission path, an optical fiber 40 is used. Using the optical fiber 40 for the second optical transmission path enables transmission of an optical signal output from the light emitting element 20 to the other devices with less loss even at a longer distance.

Here, to connect the second optical transmission path including the optical fiber 40 to the first optical transmission path as the optical waveguide member 30, a groove is formed on one end as an extension of the optical waveguide 30a in the optical waveguide member 30 and the optical fiber 40 is inserted into the groove. The size, position of the groove are adjusted so that the optical fiber 40 inserted into the groove may be optically coupled to the core of the optical waveguide 30a. Using such a structure, optical coupling between the core of the optical fiber 40 and the core of the optical waveguide 30a can be automatically made without the need of high-precision positioning. Thereby, the production cost can be reduced.

Further, when the light emitting element 20 outputs plural beams, of so-called multipoint emission type, plural optical waveguides 30a are provided on the optical waveguide member 30 as the first optical transmission path corresponding to the beams to be output from the light emission points. Furthermore, plural optical fibers 40 as the second optical transmission paths are connected correspondingly to the plural optical waveguides 30a.

Moreover, a thin film substrate 15 is fixed to cover the uppermost layer on the multilayer structure substrate 10 having the step structure. Thereby, the support substrate 21 mounted on the multilayer structure substrate 10, the light emitting element 20, the optical waveguide member 30 as the first optical transmission path are sealed within.

According to the structure, the multilayer structure substrate 10 having the step structure serves as a substrate for mounting the member and also serves as a package for sealing the member. Thus, it is not necessary to separately prepare a package as in the past. Therefore, the substrate itself becomes a package and the cost and size can be reduced.

Specific Example of Second Embodiment

A four-layer substrate using ceramics is used as the multilayer structure substrate 10, and the uppermost layer (a first layer 11) is formed in a frame shape by hollowing it with the periphery of about 1 mm left. The wiring pattern P including signal wires and power supply wires is fabricated on a second layer 12, and a part of the layer is partially hollowed to form the recessed part 10a. Further, electronic components such as a capacitor 51 are mounted on the second layer 12.

On the part of a third layer 13 in which the wiring pattern P is exposed within the recessed part 10a formed on the second layer 12, a driver IC 50, the light emitting element 20, and the optical waveguide member 30 are mounted. The light emitting element 20 is a surface emitting element.

The optical waveguide member 30 is the first optical transmission path including a polymer thin film optical waveguide. The end of the polymer thin film optical waveguide is worked with a bevel at 45 degrees and its position is adjusted so that the optical path of the light radiated from the surface emitting array element (light emitting element 20) may be converted in total reflection by the worked surface 30b worked with the bevel at 45 degrees and optically coupled to the core of the optical waveguide 30a.

Furthermore, a groove is worked on the other end of the polymer thin film optical waveguide. The optical fiber 40 is mounted in the groove, and the width and depth of the groove are adjusted so that the light passing through the core of the optical waveguide 30a may be optically coupled to the core of the optical fiber 40.

The thin film substrate 15 of a resin substrate having a thickness of about 1 mm is bonded and fixed onto the substrate of the first layer 11 of the multilayer structure substrate 10, and the multilayer structure substrate 10 including ceramics four layers and the resin substrate 15 simply seal the electronic components and optical components mounted on the multilayer structure substrate 10 except the optical fiber 40.

As shown in FIG. 4, the wiring patterns P are formed between layers, on layer front surfaces and layer rear surfaces of the multilayer structure substrate 10, and electric conduction is provided by the wiring patterns P between other layers, on other layer front faces and layer rear faces and via holes according to need.

The multilayer structure substrate 10 has the electronic components such as the capacitor 51 mounted thereon and includes wiring patterns P for forming a circuit, and serves as a package of the electronic components and optical components. Accordingly, the first layer 11 as the uppermost layer is formed in the frame shape, and provided with the end of the next upper layer (second layer 12) exposed. Terminals T are formed on the exposed part on the end of the second layer 12 in conduction to the wiring patterns P, and electric signals are input and output in connection to an external interface.

In view of use of the multilayer structure substrate 10 as a package in a thinner thickness, the recessed part 10a for exposing the wiring pattern P of the third layer 13 is provided in a part of the second layer 12. By mounting the driver IC 50 and the light emitting element 20, the optical waveguide member 30 within the recessed part 10a, electric conduction can be obtained to the wiring pattern P of the third layer 13 on the driver IC 50 according to need, and these members can be packaged on the lower position than the first layer 11 as the frame.

Here, the driver IC 50 is in conduction to the wiring pattern P of the third layer 13 (e.g., ground) on the mount surface (rear surface), and electrically connected to the wiring pattern P of the second layer 12 and the light emitting element 20 with bonding wires. Thereby, the driver IC 50 is driven by the signals (including the power supply) input from the terminals T formed on the end of the second layer 12, and light emission of the light emitting element 20 is controlled by the output of the driver IC 50.

The light emitting element 20 outputs light upward from the surface opposed to the mount surface. The output light is transmitted through a cladding part of the optical waveguide member 30 as the first optical transmission path and totally reflected on the worked surface 30b with the bevel at 45 degrees as the end of the core of the optical waveguide 30a. The totally reflected light propagates in the core of the optical waveguide 30a and travels along the surface direction of the multilayer structure substrate 10. Further, the light enters the optical fiber 40 connected to the end of the optical waveguide 30a and sent to the outside via the optical fiber 40.

In the embodiment, the electronic components are mounted, the electronic components and the optical components are incorporated into the multilayer structure substrate 10 forming the electric circuit, sealed by the thin film substrate 15 for packaging, and thereby, it is not necessary to prepare a separate package. In addition, a very thin optical device having only a thickness of the multilayer structure substrate 10 and a thickness of the thin film substrate 15 (several millimeters in thickness) can be provided. Further, in comparison with the first embodiment, the number of components can be reduced because the Si platform as the support substrate 21 (see FIGS. 1 and 2) is not necessary.

Third Embodiment

Figure 5:
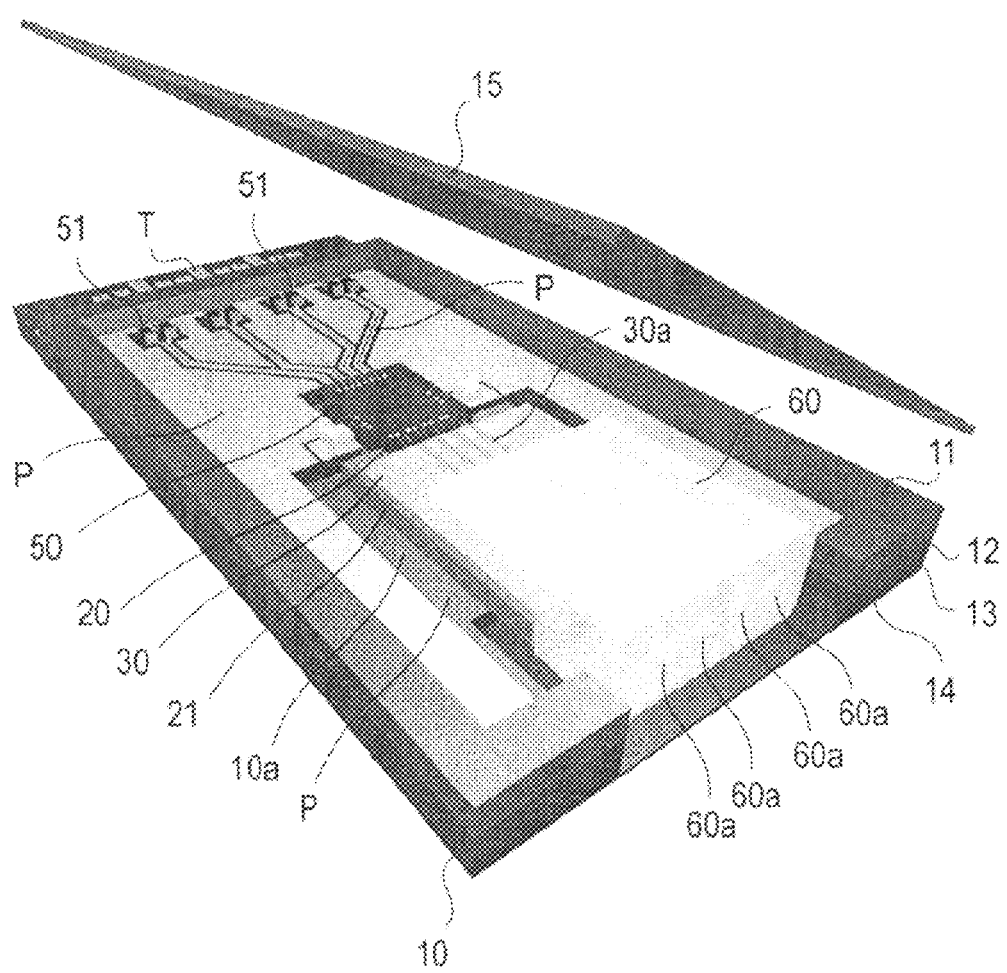
FIG. 5 is a perspective view of an optical device according to a third embodiment.

FIG. 5 is a perspective view of an optical device according to a third embodiment, FIG. 6 is a sectional view of the optical device according to the third embodiment. That is, the optical device according to the third embodiment includes a multilayer structure substrate 10, an optical element 20 mounted via a support substrate 21, and an optical waveguide member 30.

The multilayer structure substrate 10 includes at least two stacked layers (insulating layers) and a wiring pattern P formed between the layers. On the multilayer structure substrate 10, a recessed part 10a is formed by cutting off a part of the at least one layer including the uppermost layer, and a step structure is formed by the part with the recessed part 10a and the part without it.

The support substrate 21 is mounted in electric conduction to the wiring pattern P exposed by the recessed part 10a within the recessed part 10a of the multilayer structure substrate 10, and the light emitting element 20 is mounted on the support substrate 21. As the light emitting element 20, a surface emitting element that outputs light from a surface opposed to the mount surface is used, for example.

A first optical transmission path that can convert the optical path of the output light and transmit light in a direction along the surface of the multilayer structure substrate 10 above the light emitting element 20. As the first optical transmission path, the optical waveguide member 30 including an optical waveguide for transmission of light is used.

A worked surface 30b worked with a bevel at 45 degrees, for example, is formed on one end of the optical waveguide member 30, and the light output from the underneath light emitting element 20 is reflected in a horizontal direction (in the direction of the surface of the multilayer structure substrate 10) for optical path conversion. Here, the bevel worked surface 30b on the end of the optical waveguide member 30 can be easily fabricated by dicing or the like. Further, an optical waveguide 30a provided on the optical waveguide member 30 can be easily highly functionalized by providing a function of pitch conversion, branching, or the like to it.

A second optical transmission path is connected to the first optical transmission path. As the second optical transmission path, a lens array 60 having plural lenses 60a arranged on an end thereof is used. Using the lens array 60 for the second optical transmission path, the optical signal output from the light emitting element 20 is diffused or focused for reliable optical coupling to an external optical member.

Further, when the light emitting element 20 outputs plural beams, of so-called multipoint emission type, plural optical waveguides 30a are provided on the optical waveguide member 30 as the first optical transmission path corresponding to the beams to be output from the light emission points. Furthermore, plural lenses 60a are provided in the lens array 60 as the second optical transmission path.

In the embodiment, in view of providing desired lens characteristics using lenses having a certain degree of size as lenses 60a of the lens array 60, the pitch of the optical waveguides 30a of the optical waveguide member 30 as the first optical transmission path is converted according to the pitch of the lenses 60a. That is, the pitch of the light emission points of the light emitting element 20 is very narrow in view of making many elements from one substrate (wafer) in manufacture of the light emitting element 20. On the other hand, the pitch of the lenses 60a is larger than the pitch of the light emission points of the light emitting element 20. Accordingly, the pitch of the optical waveguides 30a of the optical waveguide member is narrow at the light emitting element 20 side, becomes wider from the middle part by pitch conversion, and is made equal to the pitch of the lenses 60a at the lens array 60 side.

Moreover, a thin film substrate 15 is fixed to cover the uppermost layer on the multilayer structure substrate 10 having the step structure. Thereby, the support substrate 21 mounted on the multilayer structure substrate 10, the light emitting element 20, and the optical waveguide member 30 as the first optical transmission path are sealed within.

According to the structure, the multilayer structure substrate 10 having the step structure serves as a substrate for mounting the member and also serves as a package for sealing the member. Thus, it is not necessary to separately prepare a package as in the past. Therefore, the substrate itself becomes a package and the cost and size can be reduced.

Specific Example of Third Embodiment

A four-layer substrate using ceramics is used as the multilayer structure substrate 10, and the uppermost layer (a first layer 11) is formed in a frame shape by hollowing it with the periphery of about 1 mm left. The wiring pattern P including signal wires and power supply wires is fabricated on a second layer 12, and a part of the layer is partially hollowed to form the recessed part 10a. Further, electronic components such as a capacitor 51 are mounted on the second layer 12.

On the part of a third layer 13 in which the wiring pattern P is exposed within the recessed part 10a formed on the second layer 12, a driver IC 50 and an Si (silicon) platform as the support substrate 21 are mounted. A step is worked on the Si platform, and the light emitting element 20 as a surface emitting element is mounted on the lower part. The Si platform sets the height position of the light emitting element 20, and also serves to cool and electrically ground the light emitting element 20.

Further, the first optical transmission path (optical waveguide member 30) including a polymer thin film optical waveguide is mounted on the Si platform. One end of the polymer thin film optical waveguide is worked with a bevel at 45 degrees and its position is adjusted so that the optical path of the light radiated from the surface emitting array element (light emitting element 20) may be converted in total reflection by the worked surface 30b worked with the bevel at 45 degrees and optically coupled to the core of the optical waveguide 30a.

Furthermore, the lens array 60 is mounted on the other end of the polymer thin film optical waveguide. The lens array 60 is provided in an L-shape, and correct positioning in the height direction and the optical axis direction is reliably performed by fitting the L-shape on the other end of the polymer thin film optical waveguide.

The lenses 60a of the lens array 60 form a micro lens array having a lens diameter of about 400 μm and a pitch of about 500 μm. The optical waveguide member 30 converts the optical path of the light output from the underneath light emitting element 20 and converts the pitch according to the lens pitch of the lens array 60.

That is, one end of the polymer thin film optical waveguide is worked with a bevel at 45 degrees and its position is adjusted so that the optical path of the light radiated from the surface emitting array element (light emitting element 20) may be converted in total reflection by the worked surface 30b worked with the bevel at 45 degrees and optically coupled to the core of the optical waveguide 30a. Further, the pitch at the worked surface 30b side of the optical waveguide 30a is set to about 250 μm according to the pitch of the light emission points of the light emitting element 20, becomes gradually wider from the middle, and is about 500 μm according to the lens pitch at the lens array 60 side.

The thin film substrate 15 of a resin substrate having a thickness of about 1 mm is bonded and fixed onto the substrate of the first layer 11 of the multilayer structure substrate 10, and the multilayer structure substrate 10 including ceramics four layers and the resin substrate 15 simply seals the electronic components and optical components mounted on the multilayer structure substrate 10 except the lens array 60.

As shown in FIG. 6, the wiring patterns P are formed between layers, on layer front surfaces and layer rear surfaces of the multilayer structure substrate 10, and electric conduction is provided by the wiring patterns P between other layers, on other layer front faces and layer rear faces and via holes according to need.

The multilayer structure substrate 10 has the electronic components such as the capacitor 51 mounted thereon and includes wiring patterns P for forming a circuit, and serves as a package of the electronic components and optical components. Accordingly, the first layer 11 as the uppermost layer is formed in the frame shape, and provided with the end of the next upper layer (second layer 12) exposed. Terminals T are formed on the exposed part on the end of the second layer 12 in conduction to the wiring patterns P, and electric signals are input and output in connection to an external interface.

In view of use of the multilayer structure substrate 10 as a package in a thinner thickness, the recessed part 10a for exposing the wiring pattern P of the third layer 13 is provided in a part of the second layer 12. By mounting the driver IC 50 and the light emitting element 20 via the support substrate 21 within the recessed part 10a, electric conduction can be obtained to the wiring pattern P of the third layer 13 on the driver IC 50 and the mount surface of the support substrate 21 according to need, and these members can be packaged on the lower position than the first layer 11 as the frame.

Here, the driver IC 50 is in conduction to the wiring pattern P of the third layer 13 (e.g., ground) on the mount surface (rear surface), and electrically connected to the wiring pattern P of the second layer 12 and the light emitting element 20 with bonding wires. Thereby, the driver IC 50 is driven by the signals (including the power supply) input from the terminals T formed on the end of the second layer 12, and light emission of the light emitting element 20 is controlled by the output of the driver IC 50.

The light emitting element 20 outputs light upward from the surface opposed to the mount surface. The output light is transmitted through a cladding part of the optical waveguide member 30 as the first optical transmission path and totally reflected on the worked surface 30b with the bevel at 45 degrees as the end of the core of the optical waveguide 30a. The totally reflected light propagates in the core of the optical waveguide 30a and travels along the surface direction of the multilayer structure substrate 10. Further, the light enters the lens array 60 connected to the end of the optical waveguide 30a and output to the outside via the lenses 60a.

In the embodiment, the electronic components are mounted, the electronic components and the optical components are incorporated into the multilayer structure substrate 10 forming the electric circuit, sealed by the thin film substrate 15 for packaging, and thereby, it is not necessary to prepare a separate package. In addition, a very thin optical device having only a thickness of the multilayer structure substrate 10 and a thickness of the thin film substrate 15 (several millimeters in thickness) can be provided.

Other Application Examples

In the above described respective embodiments, the optical device (light transmission module) using the light emitting element 20 as an optical element has been explained as an example, however, an optical device (light reception module) using a light receiving element can be applied. In this case, the optical signal sent from the outside is received by the optical fiber 40 (the first and second embodiments) or the lens array 60 (the third embodiment) and transmitted by the optical waveguide member 30, and the optical path of the light is converted by the bevel worked surface 30b. Then, the light after optical path conversion is received by the receiving element provided as the optical element, and converted into an electric signal. Then, the electric signal is processed by a signal processing IC provided in place of the driver IC 50, and sent to a device at the downstream from the terminal T via the wiring pattern P.

Further, the embodiments can be applied to the case of using both the light emitting element 20 and the light receiving element. In this case, a driver IC corresponding to the light emitting element 20 and a signal processing IC corresponding to the light receiving element are mounted and electric connection to the respective components are made. Thereby, a transmission and reception module using an optical signal in which the light output from the light emitting element 20 is transmitted to the outside in the same manner as that in the above described embodiments, and the light transmitted from the outside is converted into an electric signal by the light receiving element and transmitted to a device at the downstream can be formed.

In the embodiments, since the optical device can be made smaller and thinner, the optical device of the embodiments can be applied to a connector (plug) of an optical cable as it is. Especially, even in the case of using a multipoint light emitting, light receiving elements, optical paths can be accurately and easily coupled with respect to plural optical paths using the optical waveguide member 30 including the polymer thin film optical waveguide, and a small optical device for multi-channel optical communications can be provided.

In the above described embodiments, the surface emitting type light emitting element 20 that outputs light from the surface opposed to the mount surface has been explained as an example, however, an edge emitting type light emitting element that outputs light from a surface vertical to the mount surface may be used. In this case, the bevel worked surface 30b of the optical waveguide member 30 is not necessary and the optical path of the light output from the optical element is not changed but the light may be taken from the edge of the optical waveguide member 30.

The present application contains subject matter related to that disclosed in Japanese Priority Patent Application JP 2008-190603 filed in the Japan Patent Office on Jul. 24, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An optical device comprising:
    an optical element configured to output light, said optical element being within a recessed part;
    an optical waveguide member configured to provide an optical path for said light, said optical waveguide member being within said recessed part,
    wherein said recessed part is an opening through a first layer, said opening extending to a first wiring pattern,
    wherein a second layer is between said first wiring pattern and a second wiring pattern, an electric conduction through said second layer being configured to electrically conduct said first wiring pattern to said second wiring pattern.

2. The optical device according to claim 1, wherein said opening extends to a wire of the first wiring pattern.

3. The optical device according to claim 1, further comprising:
    a driving circuit electrically conducted to said first wiring pattern and said optical element, said driving circuit being within said recessed part.

4. The optical device according to claim 1, wherein said first layer is an insulating layer.

5. The optical device according to claim 1, wherein said light travels along said optical path, a bevel worked surface at an end of the optical waveguide member being configured to convert a direction of the optical path.

6. The optical device according to claim 1, wherein said optical element is configured to output plural beams of the light, plural optical waveguides of the optical waveguide member being configured to guide said plural beams.

7. The optical device according to claim 1, wherein said optical waveguide member is connected to a lens member, said lens member being configured to diffuse or focus said light.

8. The optical device according to claim 1, wherein said optical waveguide member connected to an optical fiber, said optical fiber being configured to transmit said light from said optical waveguide.

9. The optical device according to claim 8, wherein said optical fiber is connected to a groove in a part of the optical waveguide, said light in the optical waveguide member being guided by said groove.

10. The optical device according to claim 8, wherein a non-recessed part of the first layer encircles said recessed part, said optical fiber extending from said recessed part through said non-recessed part.

11. The optical device according to claim 10, wherein a thin film substrate is affixed to said non-recessed part, said thin film substrate encapsulating said recessed part.

12. The optical device according to claim 11, wherein said thin film substrate is a resin substrate.

13. The optical device according to claim 1, wherein said optical element and said optical waveguide member are mounted to a support substrate.

14. The optical device according to claim 13, wherein said optical element is between a portion of the support substrate and a portion of the optical waveguide member.

15. The optical device according to claim 13, wherein said support substrate is silicon.

16. The optical device according to claim 13, wherein said support substrate is configured to cool said optical element.

17. The optical device according to claim 13, wherein said support substrate is configured to electrically ground said optical element.

18. The optical device according to claim 1, wherein said optical element and said optical waveguide member are mounted to said second wiring pattern.

19. The optical device according to claim 1, wherein said optical element is between a portion of the second wiring pattern and a portion of the optical waveguide member.

20. The optical device according to claim 1, wherein a capacitor is mounted to said second layer.

21. The optical device according to claim 1, wherein said second layer is an insulating layer.

22. The optical device according to claim 1, wherein a support substrate is mounted to said second wiring pattern.

23. The optical device according to claim 22, wherein said optical element and said optical waveguide member are mounted to said support substrate.

24. The optical device according to claim 1, wherein a third layer is between said second wiring pattern and a third wiring pattern, a fourth layer being between said third wiring pattern and a fourth wiring pattern.

25. The optical device according to claim 24, wherein said third and fourth layers are insulating layers.

26. The optical device according to claim 24, wherein an electric conduction through said second, third and fourth layers is configured to electrically conduct said first wiring pattern to said fourth wiring pattern.

27. The optical device according to claim 24, wherein an electric conduction through said third and fourth layers is configured to electrically conduct said second wiring pattern to said fourth wiring pattern.

28. The optical device according to claim 24, wherein an electric conduction through said fourth layer is configured to electrically conduct said third wiring pattern to said fourth wiring pattern.

* * * * *